United States Patent
Stulik

(10) Patent No.: US 7,663,424 B2
(45) Date of Patent: Feb. 16, 2010

(54) CIRCUIT AND METHOD FOR REDUCING CHARGE INJECTION AND CLOCK FEED-THROUGH IN SWITCHED CAPACITOR CIRCUITS

(75) Inventor: Paul Stulik, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 171 days.

(21) Appl. No.: 11/786,194

(22) Filed: Apr. 11, 2007

(65) Prior Publication Data

US 2008/0252358 A1  Oct. 16, 2008

(51) Int. Cl.
*G06F 7/64* (2006.01)
(52) U.S. Cl. .............................. 327/337; 327/91; 327/94
(58) Field of Classification Search .................... 327/91, 327/94, 337
See application file for complete search history.

(56) References Cited

U.S. PATENT DOCUMENTS

| | | | | |
|---|---|---|---|---|
| 4,308,468 A | * | 12/1981 | Olson | 327/94 |
| 4,611,135 A | * | 9/1986 | Nakayama et al. | 327/391 |
| 5,111,072 A | * | 5/1992 | Seidel | 327/94 |
| 5,130,571 A | * | 7/1992 | Carroll | 327/94 |
| 5,187,390 A | | 2/1993 | Scott, III | 307/353 |
| 5,479,121 A | | 12/1995 | Shen et al. | 327/94 |
| 5,534,815 A | * | 7/1996 | Badyal | 327/437 |
| 5,644,257 A | * | 7/1997 | Kerth et al. | 327/96 |
| 6,326,818 B1 | | 12/2001 | Sculley | 327/95 |
| 6,566,934 B1 | | 5/2003 | Goren et al. | 327/337 |
| 6,850,098 B2 | | 2/2005 | Lee et al. | 327/94 |
| 6,930,533 B2 | | 8/2005 | Budak et al. | 327/379 |
| 6,970,038 B2 | | 11/2005 | Chandrasekaran | |
| 6,992,509 B2 | | 1/2006 | Ko et al. | |
| 2004/0160263 A1 | | 8/2004 | Gupta | |
| 2006/0132177 A1 | | 6/2006 | Brooks et al. | |

FOREIGN PATENT DOCUMENTS

JP    01-272312    10/1989
KR    10-2006-0077156    7/2006

* cited by examiner

*Primary Examiner*—Kenneth B. Wells
(74) *Attorney, Agent, or Firm*—John J. Patti; Wade J. Brady, III; Frederick J. Telecky, Jr.

(57) ABSTRACT

A low charge injection, low clock feed-through switch (1) has an input signal (Vin) applied both to the sources of first (S1) and second (2) switching transistors. A first clock signal (P) having pulses of a first duration ts is applied to a gate of the first switching transistor, and a second clock signal ($P_{coarse}$) having pulses of a second duration m×ts substantially less than the first duration is applied to a gate of the second switching transistor. A capacitor (C) is charged toward the input voltage through both the first and second switching transistors during the pulse of the second clock signal. The capacitor is charged further toward the input voltage during a remaining portion of the pulse of the first clock signal.

14 Claims, 6 Drawing Sheets

CIRCUIT AND METHOD FOR REDUCING CHARGE INJECTION AND CLOCK FEED-THROUGH IN SWITCHED CAPACITOR CIRCUITS

BACKGROUND OF THE INVENTION

The present invention relates generally to integrated circuits including switched capacitor circuits, and more particularly to circuits and methods for reducing charge injection and clock feed-through in switched capacitor circuits.

An increasing number of modern analog and mixed-signal integrated circuits, such as analog-to-digital converters, digital-to-analog converters, sample-and-hold circuits, and analog filters, use switched capacitor circuits as basic building blocks. The continued demand for improved performance of such analog and mixed-signal circuits has resulted in more stringent requirements for the switched capacitor circuits.

Two fundamental problems which often limit the achievable precision in switched capacitor circuits are the charge injection and clock feed-through mechanisms associated with the turning off of metal-oxide-semiconductor (MOS) transistor switch elements in the switched capacitor circuits. Both charge injection and clock feed-through mechanisms introduce unwanted charges into nodes of switched capacitor circuits. These unwanted charges have the particularly detrimental effects of causing erroneous voltages to appear at high impedance circuit nodes. FIG. 1 shows an N-channel MOS field effect transistor having a source S and drain D, and also a gate G receiving a clock pulse CK. FIG. 2 shows a conventional CMOS transmission gate including an N-channel transistor M1 and a P-channel transistor M2 having its gate coupled to receive the logical complement of clock pulse CK. MOS transistors and CMOS transmission gates are commonly used in switched capacitor circuits, and are subject to clock feed-through and charge injection. "Clock feed-through" and "charge injection" are two separate mechanisms which cause an error voltage in switched capacitor circuits. While both of these mechanisms cause an error at the same time (on falling clock edges for N-channel transistors and on rising clock edges for P-channel transistors), they are unrelated in the sense that one mechanism does not cause the other. The error due to "clock feed-through" arises specifically from the gate overlap capacitances while the error from "charge injection" arises specifically from the charge that is stored in the channel area of a turned-on MOS transistor. When the MOS transistor turns off, this stored channel charge leaves the channel area and is "injected" into the source and drain terminals. To avoid confusion, the error due to "clock feed-through" is generally not referred to as "charge injection" as this term is reserved for the channel charge being "injected" to source/drain terminals.

There has been a great deal of effort to minimize the effects of charge injection from MOS switches in switched capacitor circuits, by using various known compensation schemes. The known charge injection compensation schemes aim to compensate for the charges injected into critical circuit nodes after the charges have been injected by the turning off of MOS switches. FIG. 3 shows a switched capacitor circuit used in a known technique for compensating for charge injection, described in U.S. Pat. No. 5,479,121 entitled "Compensating Circuit for MOSFET Analog Switches" issued Dec. 26, 1995 to Shen et al.

A first source of the error in a MOS transistor used as a switch in a switched capacitor circuit is the above mentioned channel charge that is "injected" into the source and drain electrodes when the transistor turns off. The fraction of the channel charge that flows to the source and drain depends on the source and drain impedances and also on the transition time of the clock signal CK which turns the transistor off.

A second source of the error in an MOS transistor switch is "clock feed-through" caused by gate-source and gate-drain overlap capacitances of the transistor. The overlap capacitance is directly proportional to the width W of the channel of the transistor. As the clock CK undergoes a transition which turns off the MOS transistor, the gate-source overlap capacitance causes the charge stored on a capacitor connected to the source electrode to change, and therefore cause a voltage change across the capacitor. The voltage change is referred to as "clock feed-through".

FIGS. 4A and 4B show another circuit and associated timing diagram used to compensate for charge injection, described in U.S. Pat. No. 6,850,098 entitled "Method for Nulling Charge Injection in Switched Networks" issued Feb. 1, 2005 to Lee et al. The known charge injection compensation schemes have a number of disadvantages compared to the invention subsequently described herein. For example, the circuit of FIG. 4A relies on matching of switches S1, S2, and S3 as well as on matching capacitors C2 and C3. In the prior art circuit of FIG. 4A, the compensating switches S2 and S3 are turned on during the "nulling phase" while the critical switch S1 is turned off. Any mismatch in the three switches and any mismatch in the two capacitors will impair the ability of this circuit to effectively cancel the charge injection and clock feed-through. Typically the switches are relatively small devices and that means that they cannot be matched very well. The most notable disadvantages limiting the practicality of known charge injection compensation schemes include (1) relatively large integrated circuit chip layout area required for implementation, (2) increased circuit layout complexity which results in sub-optimal chip layout configurations, (3) the need to rely on matching of compensating switches and/or compensating capacitors for effective charge injection compensation, (4) inability to compensate charge injection in certain circuit topologies and limited ability to compensate charge injection in the other circuit topologies, (5) inability to reduce mismatches in charge injection into differential circuit nodes, and (6) introduction of additional capacitive loading to operational amplifiers used within switched capacitor circuits, resulting in increased power dissipation of the operational amplifiers.

Thus, there is an unmet need for a practical circuit and technique for significantly reducing both charge injection and clock feed-through in switched capacitor integrated circuits.

There also is an unmet need for a practical circuit and technique for significantly reducing charge injection mismatches and mismatches in clock feed-through.

There also is an unmet need for a circuit and technique for significantly reducing both charge injection and clock feed-through in switched capacitor integrated circuits that is very simple to implement and that occupies very small amount of chip layout area.

There also is an unmet need for a practical circuit and technique for significantly reducing both charge injection and clock feed-through in switched capacitor integrated circuits which requires very low power dissipation and which occupies very small amount of chip layout area.

There also is an unmet need for a practical circuit and technique for significantly reducing both charge injection and clock feed-through in switched capacitor integrated circuits which requires very low power dissipation and which does not rely on component matching.

SUMMARY OF THE INVENTION

It is an object of the invention to provide a practical circuit and technique for significantly reducing both charge injection and clock feed-through in switched capacitor integrated circuits.

It is another object of the invention to provide a practical circuit and technique for significantly reducing charge injection mismatches and mismatches in clock feed-through.

It is another object of the invention to provide a circuit and technique for significantly reducing both charge injection and clock feed-through in switched capacitor integrated circuits that is very simple to implement and that occupies very small amount of chip layout area.

It is another object of the invention to provide a practical circuit and technique for significantly reducing both charge injection and clock feed-through in switched capacitor integrated circuits which requires very low power dissipation and that occupies very small amount of chip layout area.

It is another object of the invention to provide a practical circuit and technique for significantly reducing both charge injection and clock feed-through in switched capacitor integrated circuits which requires very low power dissipation and which does not rely on component matching.

Briefly described, and in accordance with one embodiment, the present invention provides a low charge injection, low clock feed-through switch (1) has an input signal (Vin) applied to the sources of both first (S1) and second (S2) switching transistors. A first clock signal (P) having pulses of a first duration ts is applied to a gate of the first switching transistor, and a second clock signal ($P_{coarse}$) having pulses of a second duration m×ts substantially less than the first duration is applied to a gate of the second switching transistor. A capacitor (C) is charged toward the input voltage through both the first and second switching transistors during the pulse of the second clock signal. The capacitor is charged further toward the input voltage during a remaining portion of the pulse of the first clock signal.

In one embodiment, the invention provides a switched capacitor circuit including a first switching transistor (S1) having a first current-carrying electrode coupled to receive a first signal (Vin) via a first conductor (N1), a second current-carrying electrode coupled to a second conductor (N2), and a gate electrode coupled to receive a first clock signal (P) having a first pulse duration ts wherein the second conductor (N2) conducts a second signal ($Vout_B$). A second switching transistor (S2) has a first current-carrying electrode coupled to receive the first signal (Vin), a second current-carrying electrode coupled to the second conductor (N2), and a gate electrode coupled to receive a second clock signal ($P_{coarse}$) which has a second pulse duration m×ts that is substantially less than the first pulse duration ts, m being less than 1.0. In a described embodiment, pulses of the first clock signal (P) begin at substantially the same times as pulses of the second clock signal ($P_{coarse}$). In a described embodiment, a capacitor (C) is coupled between the second conductor (N2) and a reference voltage. In one embodiment, the first current-carrying electrode of the second switching transistor (S2) is coupled to receive the first signal (Vin) by means of a buffer (11). In one embodiment, at least one of the first (S1) and second (S2) switch transistors is a N-channel transistor. In one embodiment, at least one of the first (S1) and second (S2) switch transistors is a CMOS transmission gate.

In the described embodiments, the capacitor (C) is charged through the first (S1) and second (S2) switching transistors such that the second signal ($Vout_B$) reaches a first level $Vin-er_B(m \times ts)$ during the second pulse duration (m×ts), where $$er_B(m \cdot ts) = e^{-\left(\frac{ts}{C} \cdot m \cdot \frac{R_{S1}+R_{S2}}{R_{S1} \cdot R_{S2}}\right)} \text{ and}$$

$$er_B(ts) = e^{-\frac{ts}{C} \cdot \left(m \cdot \frac{R_{S1}+R_{S2}}{R_{S1} \cdot R_{S2}} + \frac{1-m}{R_{S1}}\right)},$$

where $er_B(ts)$ is the amount of an error voltage at the end of the first pulse duration (ts), $er_B(m \times ts)$ is the amount of the error voltage at the end of the second pulse duration (m×ts), and where $R_{S1}$ and $R_{S2}$ are series resistances of the first (S1) and second (S2) switching transistors, respectively. In one embodiment, $R_{S1}$ and $R_{S2}$ and m have values which cause the second level $Vin-er_B(ts)$ to have the same settling accuracy as would be the case if the first (S1) and second (S2) switching transistors were to be replaced by a single switching transistor controlled by the first clock signal (P) and having a series resistance $R_S$ related to the series resistances $R_{S1}$ and $R_{S2}$ and m by the expression $$R_S = \frac{R_{S1} \cdot R_{S2}}{m \cdot (R_{S1} + R_{S2}) + (1-m) \cdot R_{S2}}.$$

In one embodiment, the switched capacitor circuit (3 of FIG. 7C) includes a first sampling transistor (S1p), a second sampling transistor (S1n), a first sampling capacitor (Cp), and a second sampling capacitor (Cn). The first sampling transistor (S1p) has a first current-carrying electrode coupled to receive a first input signal (Vinp), a second current-carrying electrode coupled to a first terminal (n1p) of the first sampling capacitor (Cp), and a gate coupled to receive a third clock signal (P1d) which has a third pulse duration slightly longer than the first pulse duration. The second sampling transistor (S1n) has a first current-carrying electrode coupled to receive a second input signal (Vinn), a second current-carrying electrode coupled to a first terminal (n1n) of the second sampling capacitor (Cn), and a gate coupled to receive the third clock signal (P1d). The first conductor (N1) is coupled to a second terminal (n2p) of the first sampling capacitor (Cp) and the second conductor (N2) is coupled to a second terminal (n2n) of the second sampling capacitor (Cn). A first output voltage (Voutp) is produced on the first conductor (n2p) and a second output voltage (Voutn) is produced on the second conductor (n2n).

In one embodiment, the first switching transistor is a first sampling transistor (S1p) and the second switching transistor is a second sampling transistor ($S1p_{coarse}$), the capacitor (C) is a first sampling capacitor (Cp) and the first conductor is a first output conductor (n2p) of the switched capacitor circuit (4) and the first signal is a first input signal (Vinp), and the switched capacitor circuit (4) further includes a third switching transistor (S1n) having a first current-carrying electrode coupled to receive a second input signal (Vinn), a second current-carrying electrode coupled to a first terminal (n1n) of a second sampling capacitor (Cn), and a gate electrode coupled to receive the first clock signal (P1d), and a fourth switching transistor ($S1n_{coarse}$) having a first current-carrying electrode coupled to receive a second input signal (Vinn), a second current-carrying electrode coupled to the first terminal (n1n) of the second sampling capacitor (Cn), and a gate electrode coupled to receive the second clock signal (P1$_{coarse}$).

In one embodiment, the invention provides a switched capacitor circuit (5 of FIG. 8C) including a first sampling transistor (S1p) having a first current-carrying electrode coupled to receive a first input signal (Vinp), a second current-carrying electrode coupled to a first terminal (n1p) of a first sampling capacitor (Cp), and a gate coupled to receive a first clock signal (P1d). A second sampling transistor (S1n) has a first current-carrying electrode coupled to receive a second input signal (Vinn), a second current-carrying electrode coupled to a first terminal (n1n) of a second sampling capacitor (Cn), and a gate coupled to receive the first clock signal (P1d). A first switching transistor (S2p) has a first current-carrying electrode coupled to a second terminal (n2p) of the first sampling capacitor (Cp), a second current-carrying electrode coupled to a reference voltage (Vcom), and a gate electrode coupled to receive a second clock signal (P1) having a second pulse duration ts which is less than a first pulse duration of the first clock signal (P1d). A second switching transistor (S2n) has a first current-carrying electrode coupled to the reference voltage (Vcom), a second current-carrying electrode coupled to a second terminal (n2n) of the second sampling capacitor (Cn), and a gate electrode coupled to receive the second clock signal (P1). A third switching transistor (S2$_{coarse}$) has a first current-carrying electrode coupled to the second terminal (n2p) of the first sampling capacitor (Cp), a second current-carrying electrode coupled to the second terminal (n2n) of the second sampling capacitor (C2p), and a gate electrode coupled to receive a third clock signal (P1$_{coarse}$) having a third pulse duration m×ts which is substantially less than the second pulse duration ts.

In one embodiment, the invention provides a method for reducing charge injection and clock feed-through in a switched capacitor circuit, the method including applying a first signal (Vin) both to a first current-carrying electrode of a first switching transistor (S1) and a first current-carrying electrode of a second switching transistor (S2), applying a first clock signal (P), which has a pulse of a first duration ts beginning at a predetermined time, to a gate electrode of the first switching transistor (S1) and applying a second clock signal (P$_{coarse}$) which has a pulse of a second duration m×ts which is substantially less than the first pulse duration ts and which begins at substantially the same time as the first pulse duration ts, to a gate electrode of the second switching transistor (S2), charging a capacitor (C) toward the first signal (Vin) through both the first (S1) and second (S2) switching transistors during the pulse of the second clock signal (P$_{coarse}$), and continuing to charge the capacitor (C) further toward the first signal (Vin) through only the first switch (S1) during a remaining portion of the pulse of the first clock signal (P).

In one embodiment, the invention provides circuitry for reducing charge injection and clock feed-through in a switched capacitor circuit, the circuitry including means (N1 or n2p) for applying a first signal (Vin or Voutp) both to a first current-carrying electrode of a first switching transistor (S1) and a first current-carrying electrode of a second switching transistor (S2), means for applying a first clock signal (P), which has a first pulse of a duration ts beginning at a predetermined time, to a gate electrode of the first switching transistor (S1) and applying a second clock signal (P$_{coarse}$) having a second pulse, which has a duration m×ts which is substantially less than the first pulse duration ts and which begins at substantially the predetermined time as the first pulse duration ts, to a gate electrode of the second switching transistor (S2), means (N1 and N2) for charging a capacitor (C) toward the first voltage (Vin or Voutp) through both the first (S1) and second (S2) switching transistors during the pulse of the second clock signal (P$_{coarse}$), and means for continuing to charge the capacitor (C) further toward the first voltage (Vin or Voutp) during a remaining portion of the pulse of the first clock signal (P).

DETAILED DESCRIPTION OF THE PREFERRED EMBODIMENTS

In contrast to existing charge injection compensation schemes which aim to compensate for the charge injected into critical circuit nodes after the charge has been injected by turning off of a MOS transistor switch, the present invention operates prior to the critical clock edge at which the charge injection occurs so as to significantly reduce both charge injection and clock feed-through, and also operates so as to significantly reduce mismatches in both charge injection and clock feed-through.

Figure 1:
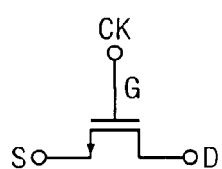
FIG. 1 shows an N-channel MOS transistor.
Figure 2:
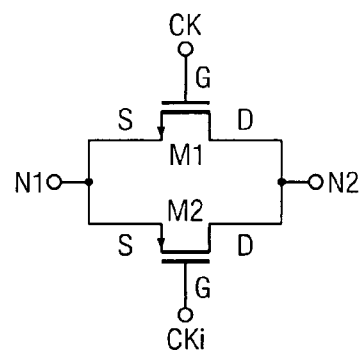
FIG. 2 shows a conventional CMOS transmission gate switch.
Figure 3:
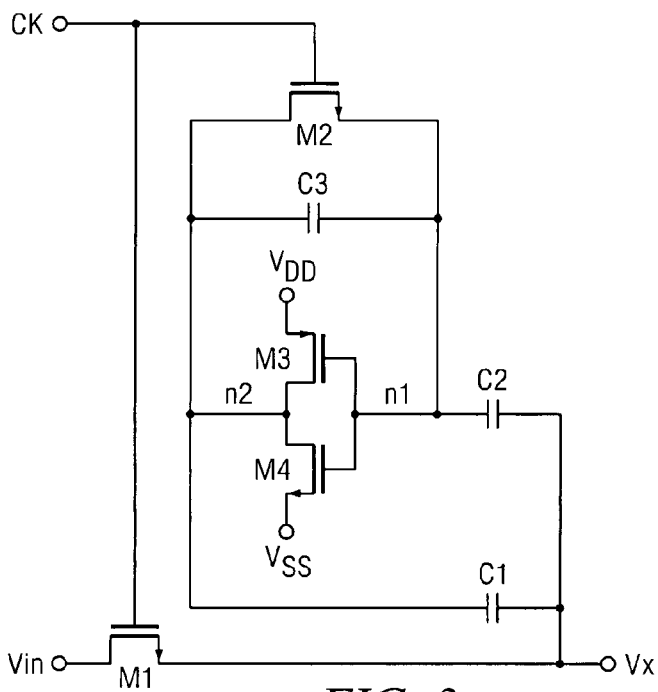
FIG. 3 shows a prior art CMOS switched capacitor circuit.
Figure 4A:
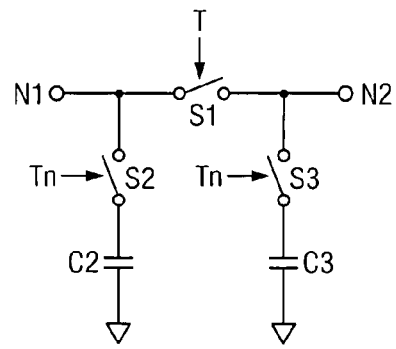
FIG. 4A shows a prior art switched capacitor circuit.
Figure 4B:
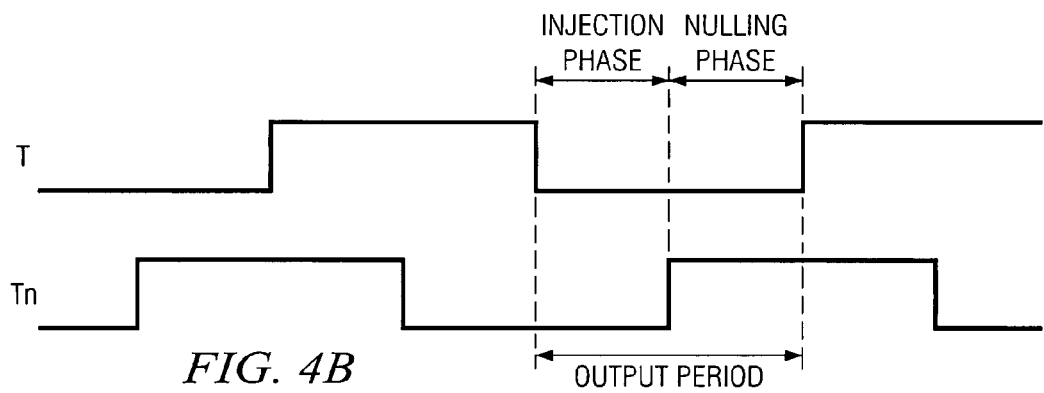
FIG. 4B is a timing diagram for the switched capacitor circuit shown in FIG. 4A.
Figure 5A:
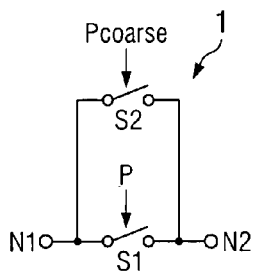
FIG. 5A shows a switch circuit used in accordance with the present invention.
Figure 5B:
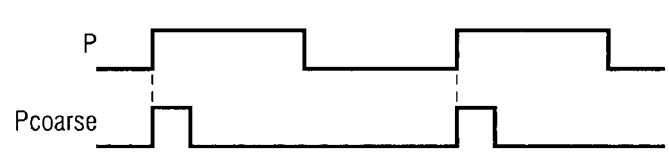
FIG. 5B is a timing diagram for the switch circuit of FIG. 5A.

Referring to FIG. 5A, the present invention provides a "low charge injection, low clock feed-through" switching circuit 1 (referred to herein simply as a "low injection switch" circuit) that includes a second "coarse" transistor switch S2 connected in parallel with main transistor switch S1 between conductors N1 and N2. FIG. 5B shows a preferred clocking sequence diagram for switches S1 and S2. Clock signal P controls switch S1, and clock signal P$_{coarse}$ controls switch S2. In this example, switches S1 and S2 are turned on when their respective clock signals are "HIGH" and are turned off when their respective clock signals are "LOW". Each of switching transistors S1 and S2 can be an N-channel MOS transistor, a P-channel MOS transistor, or a CMOS transmission gate, depending on the application.

By appropriately sizing transistor switches S1 and S2 and by appropriately choosing the duration of $P_{coarse}$, the physical size (i.e., the transistor channel width W) of main switch S1 can be significantly reduced compared to the case when second switch S2 is not being used. Since both charge injection and clock feed-through associated with the MOS transistor switch being turned off are directly proportional to the physical size (i.e., channel width W) of the switch, both charge injection and clock feed-through from the critical (i.e., main) transistor switch S1 will be reduced by the same factor, i.e., by $R_{S1}/R_{S2}$, by which the physical size of transistor switch S1 is reduced. The charge injection and clock feed-through resulting from the turning off of second switch S2 is not critical because switch S1 remains turned on after switch S2 turns off and therefore continues to correct for charge injection and clock feed-through associated with the larger switch S2, as illustrated in the $Vout_B$ waveform in FIG. 6D.

It should be appreciated that although it is best if the pulses of clocks P and $P_{coarse}$ begin at the same time as illustrated in FIGS. 5B, 6D, 7D, 7F, 8D and 8F, much of the benefit of the described embodiments of the invention can be achieved even if the beginning edges of the pulses of clock signal $P_{coarse}$ occur before or after the beginning edges of the corresponding pulses of clock signal P. Furthermore, much or most (perhaps up to 90%) of the benefit also can be achieved if the each pulse of $P_{coarse}$ ends before the beginning of the corresponding pulse of clock P, although this would have the disadvantage of lengthening the clock cycle times in a typical switched capacitor circuit.

Figure 6A:
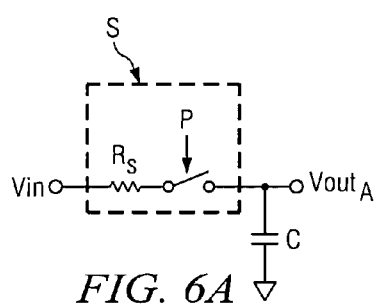
FIG. 6A is a diagram of a conventional circuit for charging a capacitor through the channel resistance of an MOS switching transistor.
Figure 6B:
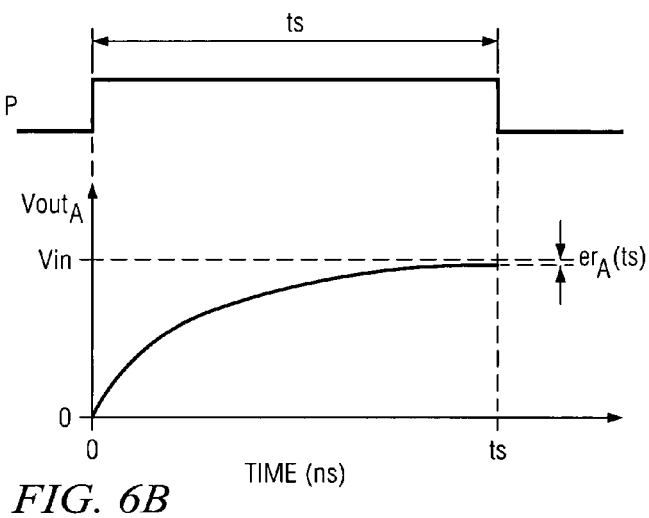
FIG. 6B is a timing diagram for the circuit of FIG. 6A.
Figure 6C:
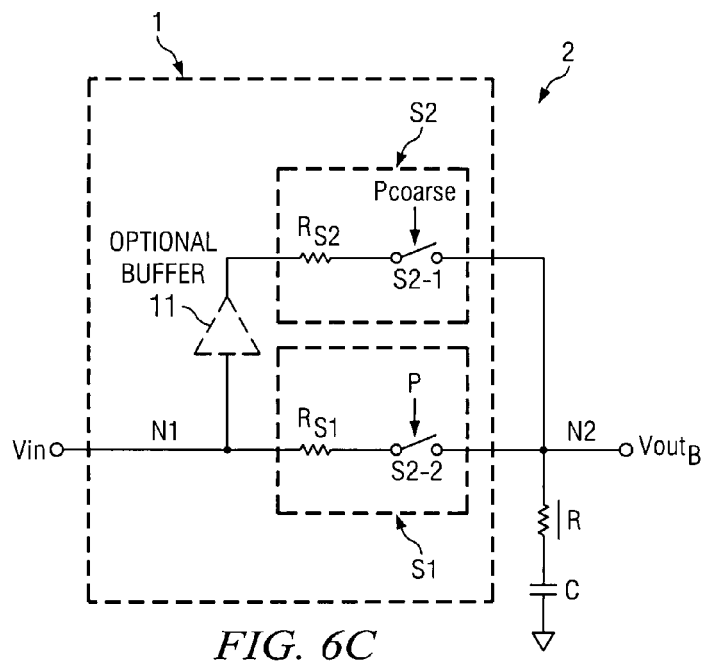
FIG. 6C is a diagram of a circuit for charging a capacitor using the switch circuit 1 of FIG. 5A.

An analysis of one embodiment of the invention is indicated by means of FIGS. 6A-D. FIG. 6A illustrates a simple conventional switched capacitor circuit in which capacitor C is coupled to a voltage source Vin through transistor switch S. Switch S has an associated series channel resistance $R_S$ and is, for the purpose of the analysis, otherwise considered to be ideal. It should be appreciated that low-injection switch circuit 1 of switched capacitor circuit 2 can be (but is not necessarily) coupled to capacitor [C] through a resistive element. In FIG. 6C, such resistive element is illustrated as a resistance R which can be an intentionally provided resistor, an MOS transistor which is included in the switched capacitor circuit and which is turned on during the sampling process, or a parasitic resistance which, as a practical matter, is always present.

As the timing diagram of FIG. 6B illustrates, switch S is turned on by clock signal P at time=0 and turned off at time=ts. Correspondingly, capacitor C is charged from 0 volts at time=0 to a value (Vin−$er_A$(ts)) at time=ts. That is, the source voltage Vin is being "sampled" onto capacitor C during sampling time interval ts. At time=ts switch S turns off and the voltage sampled onto capacitor C is equal to the voltage Vin minus the error voltage $er_A$(ts), as illustrated in FIG. 6B. The error voltage $er_A$(ts) is a result of incomplete settling, and is given by $$er_A(ts) = e^{-\left(\frac{ts}{R_S \cdot C}\right)}.\qquad\text{Eq. (1)}$$

The higher the amount of required performance is for a switched capacitor circuit, the lower the allowable amount is for the error voltage $er_A$(ts). For a given sampling time ts and a given capacitance C, the physical size (i.e., W) of the switch S has to be adjusted such that its series resistance $R_S$ is sufficiently small to satisfy the upper bound on the allowable error voltage $er_A$(ts). For high performance switched capacitor circuits, which require small error voltage $er_A$(ts) and thus require large size transistor switch channel width W, the charge injection and clock feed-through are the limiting factors in the achievable analog performance characteristics (e.g., low THD (total harmonic distortion), low INL (integral nonlinearity), low offset, etc.).

Figure 6D:
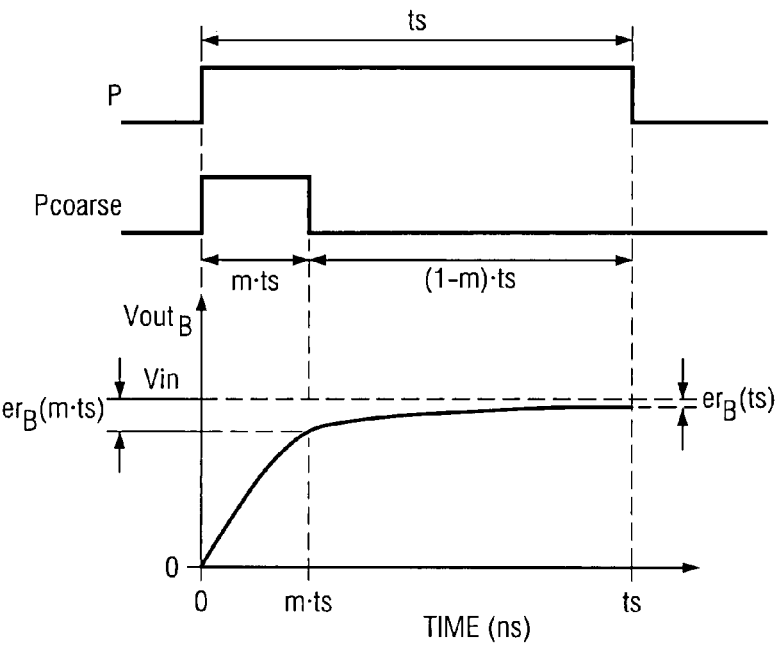
FIG. 6D is a timing diagram for the circuit of FIG. 6C.

In FIG. 6C, the single switch S of FIG. 6A has been replaced by the above described low injection transistor switch circuit 1 including main switch S1 and second switch S2 shown in FIG. 5A. The transistor switches S1 and S2 have respective associated series resistances $R_{S1}$ and $R_{S2}$ and are, for the purpose this analysis, otherwise considered to be ideal. Switch S1 in FIG. 6C is controlled by clock signal P and coarse switch S2 is controlled by clock signal $P_{coarse}$. As the timing diagram of FIG. 6D indicates, switches S1 and S2 both are turned on at time=0, switch S2 then is turned off at time=m×ts, and switch S1 then is turned off at time=ts. Thus, main switch S1 is turned on for the entire duration of sampling interval ts, whereas coarse switch S2 is only turned on for a fraction m of the sampling interval ts, defined by m×ts, where m<1. With switches S1 and S2 both turned on during the initial sampling time interval m×ts, capacitor C is charged from 0 volts at time=0 to a value (Vin−$er_B$(m×ts)) at time=m×ts, as shown in FIG. 6D. Therefore, at the end of the initial sampling time interval m×ts, the voltage sampled onto capacitor C is equal to the source voltage Vin minus the error voltage $er_B$(m×ts). The error voltage $er_B$(m×ts) is a result of the initial incomplete settling and is given by $$er_B(m \cdot ts) = e^{-\left(\frac{ts}{C} \cdot m \cdot \frac{R_{S1}+R_{S2}}{R_{S1} \cdot R_{S2}}\right)}.\qquad\text{Eq. (2)}$$

After the end of the initial sampling interval m×ts, only the main switch S1 remains turned on (i.e., closed) for the remaining portion (1−m)×ts of the total sampling interval ts. At the end of the total sampling time interval ts, the voltage sampled onto capacitor C is equal to the input or source voltage Vin minus the error voltage $er_B$(ts). The error voltage $er_B$(ts) is a result of incomplete settling and is given by:

$$er_B(ts) = e^{-\frac{ts}{C}\left(m \cdot \frac{R_{S1}+R_{S2}}{R_{S1} \cdot R_{S2}} + \frac{1-m}{R_{S1}}\right)}.\qquad\text{Eq. (3)}$$

The same settling accuracy will be achieved with the circuits of FIGS. 6A and 6C when for the same source voltage Vin, the same size capacitor C, and the same sampling time interval ts, the settling error voltages of the two circuits are equal, that is, when $er_A$(ts)=$er_B$(ts). This condition can be satisfied by appropriate choices of $R_{S1}$, $R_{S2}$ and m for the circuit of FIG. 6C. For example, choosing $R_{S1}$=2×$R_S$, $R_{S2}$=0.5×$R_S$, and m=0.25 will result in the same settling accuracy for the circuits of FIGS. 6A and 6C. In this example, since the series resistance of the main switch S1 was increased by a factor of two, the physical size of the switch S1 was correspondingly reduced by a factor of two and consequently both charge injection and clock feed-through from switch S1 were also reduced by a factor of two. The charge injection and clock feed-through introduced by the second switch S2 is not critical to the settling accuracy of the circuit of FIG. 6C because the disturbance due to charge injection and clock feed-through from switch S2 is settled by the main switch S1. From a settling accuracy point of view, the conventional switches and the low-injection switches of the present invention are equivalent if at the end of sampling phase they settle to within the same error voltage. This condition is met if $$R_S = \frac{R_{S1} \cdot R_{S2}}{m \cdot (R_{S1} + R_{S2}) + (1-m) \cdot R_{S2}}. \quad \text{Eq. (4)}$$

It should be appreciated that Vin does not necessarily have to be coupled only by node N1 to the left terminals of both transistor switches S1 and S2 as illustrated in FIG. 5A. For example, Vin can be coupled directly by conductor N1 to the left terminal of switch S1 as shown in FIG. 6C and indirectly by a unity gain buffer 11 to the left terminal of switch S2.

Although the value m=0.25 was used in the foregoing example, it should be appreciated that values of m ranging from about 0.1 to about 0.6 are practical for the low-injection switch circuit of the present invention.

By way of definition, a statement that the input signal Vin is coupled or applied to a particular terminal/electrode of transistor switches S1 and S2 is intended to encompass both direct coupling of Vin to that terminal/electrode or indirect coupling, for example by means of an optional buffer, to that terminal/electrode. For example, if the optional buffer 11 is provided as shown in FIG. 6C, Vin is to be understood as being coupled or applied to the left terminals of both switches S1 and S2. The physical size, and hence the gate capacitance, of transistor switch S2 may be substantially larger than that of transistor switch S1, so it may be advantageous in some cases to use optional buffer 11, for example to reduce loading on the source of the signal Vin.

Figure 7A:
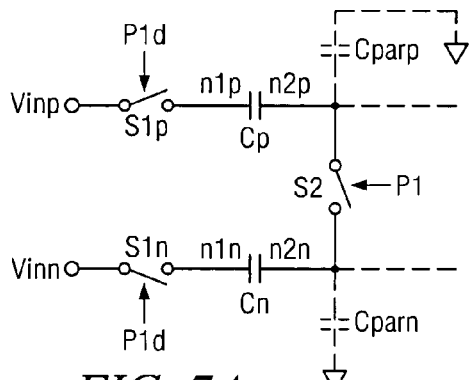
FIG. 7A is a diagram of another conventional switched capacitor circuit.
Figure 7B:
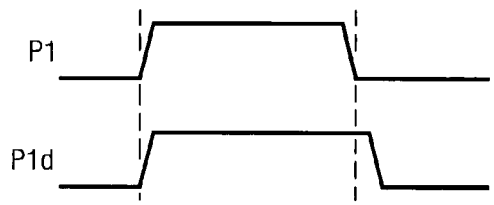
FIG. 7B is a timing diagram for the circuit of FIG. 7A.
Figure 7C:
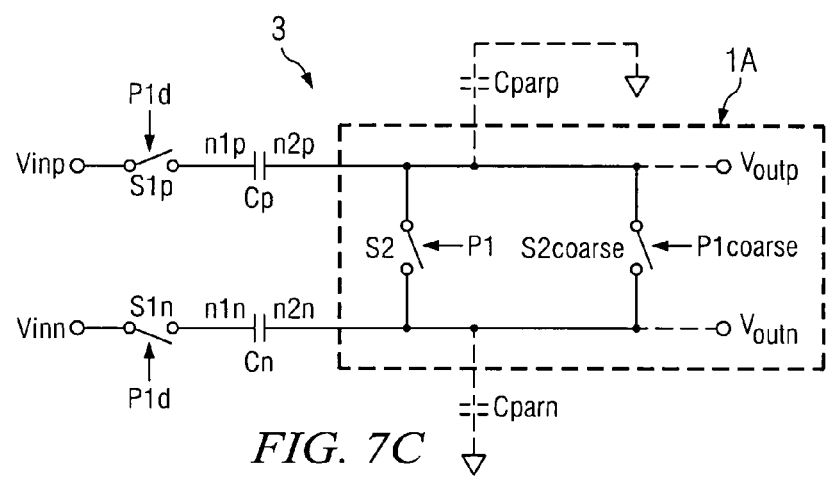
FIG. 7C is a diagram of another switched capacitor circuit in accordance with the present invention.

Also by way of definition, is to be understood that the term "capacitor" is used herein can refer both to a discrete capacitor such as sampling capacitor Cp and/or a parasitic capacitor or parasitic capacitance such as Cparp (shown in FIG. 7C).

Also by way of definition, the term "charging" as used herein is intended to encompass the term "discharging", so that a statement "charging a capacitor" can encompass the discharging of the capacitor. Also by way of definition, the source electrode and the drain electrode of a MOS field effect transistor are interchangeable, and can be referred to as "current-carrying electrodes". For example, in an N-channel MOS transistor, the current-carrying electrode which is at the lowest voltage is the source and the one which is at the highest voltage is the drain. If the voltage of the source electrode increases to a value greater than the other current-carrying electrode, it becomes the drain.

FIG. 7A shows a configuration of the differential input-sampling portion of a prior art switched-capacitor circuit commonly used, for example, in delta-sigma analog-to-digital converters. In this circuit, switch S2 is controlled by clock signal P1 and switches S1p and S1n are controlled by clock signal P1d as shown in FIG. 7B. This circuit operates to sample the differential input voltage (Vinp-Vinn) onto capacitors Cp and Cn during a phase 1 defined by the duration of clock signal P1. On the falling edge of clock signal P1, transistor switch S2 is turned off and therefore injects channel charge into nodes n2p and n2n. Even though nodes n2p and n2n are at almost equal voltages just prior to switch S2 turning off, the charge injection from switch S2 is still "differential input-dependent" due to differential input-dependent series resistances of switches S1p and S1n, which results in differential input-dependent impedances seen at nodes n2p and n2n. Consequently, the channel charge from the turning off of MOS transistor switch S2 splits unevenly and "differential input-dependently" between conductors n2p and n2n. This uneven and differential input-dependent splitting of the channel charge from transistor switch S2 as it turns off causes nonlinearity in the input voltage sampling process, and often limits the achievable linearity of the overall switched capacitor circuit and hence also of, for example, a delta-sigma analog-to-digital converter within which the switched capacitor circuit may be included. Furthermore, due to mismatches in transistor switches S1p and S1n, the charge injection and clock feed-through from the turning off of a switch S2 is also "common-mode input-dependent" and therefore contributes to the degradation of the common-mode rejection of the overall switched-capacitor circuit of Prior Art FIG. 7A.

The sampling capacitor Cp together with the parasitic capacitor Cparp in FIG. 7A form a capacitive divider between nodes n1p, n2p, and ground (or other reference voltage). Similarly, the sampling capacitor Cn together with the parasitic capacitor Cparn form a capacitive divider between nodes n1n, n2n, and ground (or other reference voltage). Due to these two capacitive dividers, when transistor switches S1p and S1n are turned off and therefore inject both differential and common-mode input-dependent charges into conductors nip and n1n, they also distort the differential voltages sampled onto capacitors Cp and Cn, and therefore also contribute to the degradation of the linearity and common-mode rejection of the overall switched-capacitor circuit.

Figure 7D:
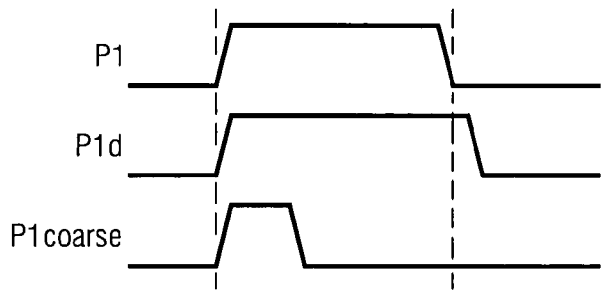
FIG. 7D is a timing diagram for the circuit of FIG. 7C.

FIG. 7C shows an embodiment 3 of the invention applied to transistor switch S2 of FIG. 7A to improve both linearity and common-mode rejection of that circuit. As indicated in FIG. 7C, switch S2 is controlled by P1 and switches S1p and S1n are controlled by P1d. In the circuit of FIG. 7C, MOS transistor switch $S2_{coarse}$, which is controlled by clock signal $P1_{coarse}$ of FIG. 7D, is provided in parallel with MOS transistor switch S2, and the size (i.e., channel width W) of switch S2 is reduced. The size reduction of switch S2 results in proportional reduction of charge injection and clock feed-through and correspondingly results in improved linearity and common-mode rejection of the switched-capacitor circuit 3.

Figure 7E:
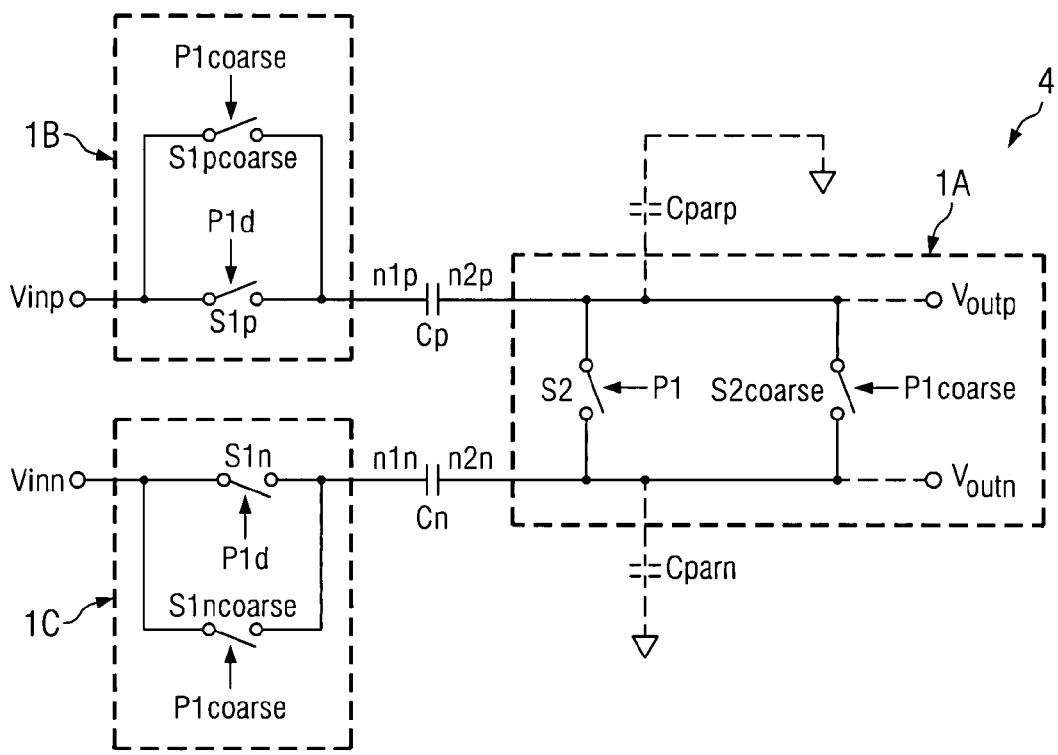
FIG. 7E is a diagram of another switched capacitor circuit in accordance with the present invention.
Figure 7F:
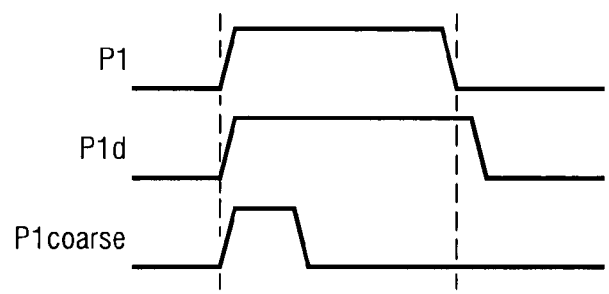
FIG. 7F is a timing diagram for the circuit of FIG. 7E.

FIG. 7E shows an embodiment 4 of the invention applied not only to switch S2 of in FIG. 7A, but also to switches S1p and S1n to further improve both linearity and common-mode rejection of the circuit shown in FIG. 7A. In the switched-capacitor circuit 4 of FIG. 7E the additional switches $S1p_{coarse}$ and $S1n_{coarse}$ both controlled by clock signal $P1_{coarse}$, are provided in parallel with switches S1p and S1n, respectively, and the size W of switches S1p and S1n is reduced. The size reduction of switches S1p and S1n results in proportional reduction of channel charge injection and clock feed-through from those switches and results in further improvement of linearity and common-mode rejection of the switched-capacitor circuit 4.

Figure 8A:
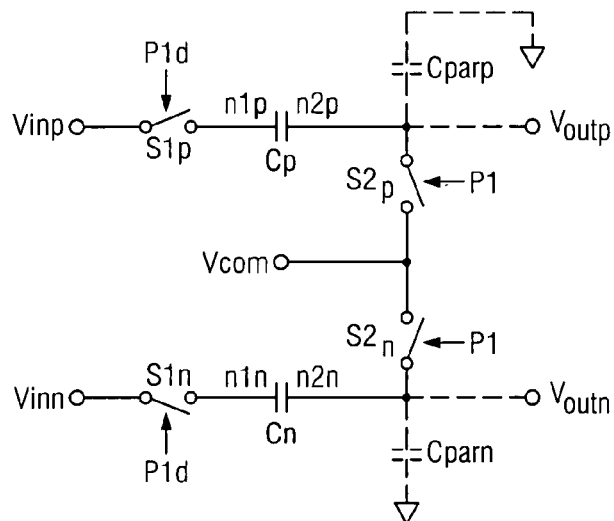
FIG. 8A is a diagram of another conventional switched capacitor circuit.
Figure 8B:
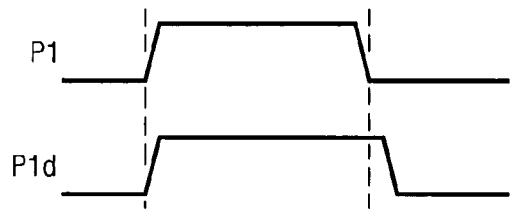
FIG. 8B is a timing diagram for the circuit of FIG. 8A.

FIG. 8A shows another prior art configuration of the differential input-sampling portion of a switched capacitor circuit commonly used, for example, in delta-sigma analog-to-digital converters. FIG. 8B shows the clock signals P1 and P1d. This circuit is similar to the circuit of FIG. 7A, with the important distinction of having the single electrically "floating" switch S2 of FIG. 7A replaced by two switches S2p and S2n, both of which sample with respect to a common mode voltage Vcom. To achieve the same settling performance in the circuits of FIGS. 7A and 8A, the size of the switches S2p and S2n in the circuit of FIG. 8A have to be made twice as large compared to the size of switch S2 in the circuit of FIG. 7A. As was the case for the prior art circuit of FIG. 7A, the charge injection and clock feed-through from switches S2p and S2n as well as from switches S1p and S1n limits the achievable linearity and common-mode rejection.

Figure 8C:
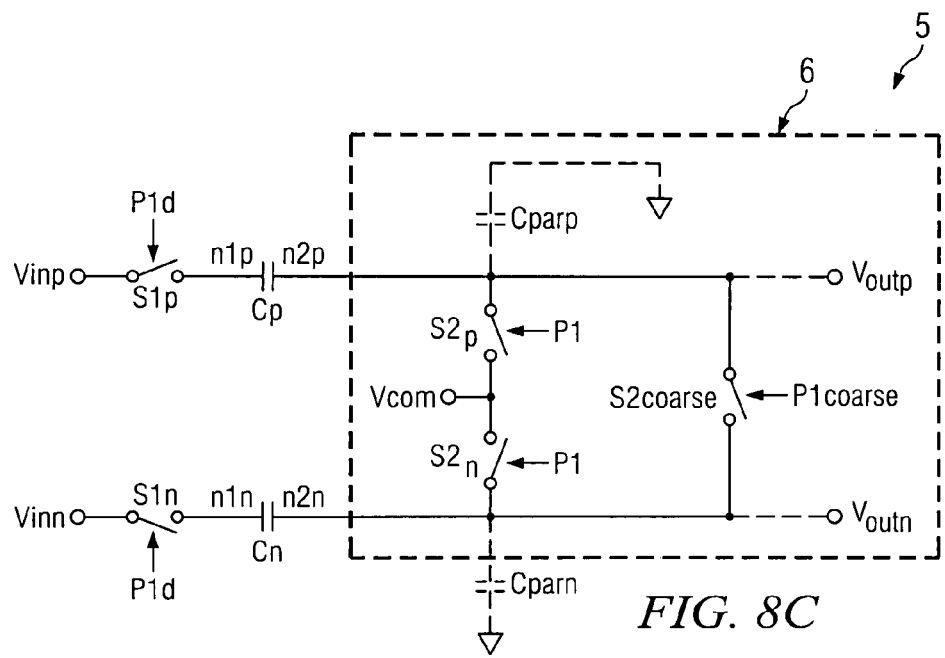
FIG. 8C is a diagram of another switched capacitor circuit in accordance with the present invention.

As the switched-capacitor circuit 5 of FIG. 8C demonstrates, the basic idea embodied in the low-injection switching circuit 1 of FIG. 5A is applicable not only to a single switch but also to a combination of switches. FIG. 8C uses low-injection switching circuit to implement the series combination of switches S2p and S2n in FIG. 8A to improve both linearity and common-mode rejection of the prior art switched-capacitor circuit shown in FIG. 8A.

Figure 8D:
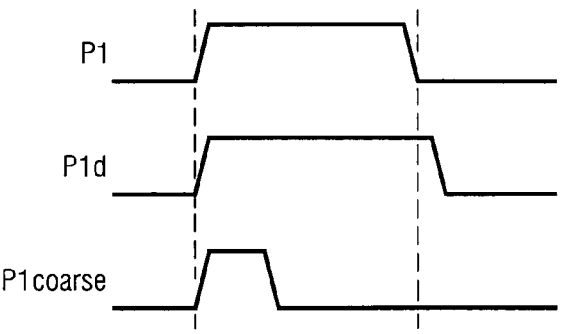
FIG. 8D is a timing diagram for the circuit of FIG. 8C.

Specifically, the circuitry 6 in FIG. 8C includes switches S2p and S2n in FIG. 8A, both controlled by P1 and also includes coarse switch S2$_{coarse}$ connected between nodes n2p and n2n and controlled by P1$_{coarse}$, which is in FIG. 8D. Using coarse switch S2$_{coarse}$, controlled by clock signal P1$_{coarse}$, across the series combination of switches S2p and S2n, allows the size of switches S2p and S2n to be reduced. Furthermore, providing switch S2$_{coarse}$ in parallel with the series combination of switches S2p and S2n allows the size of the switch S2$_{coarse}$ to be reduced by a factor of 4 compared to the case in which the invention is applied separately to switches S2p and S2n.

Figure 8E:
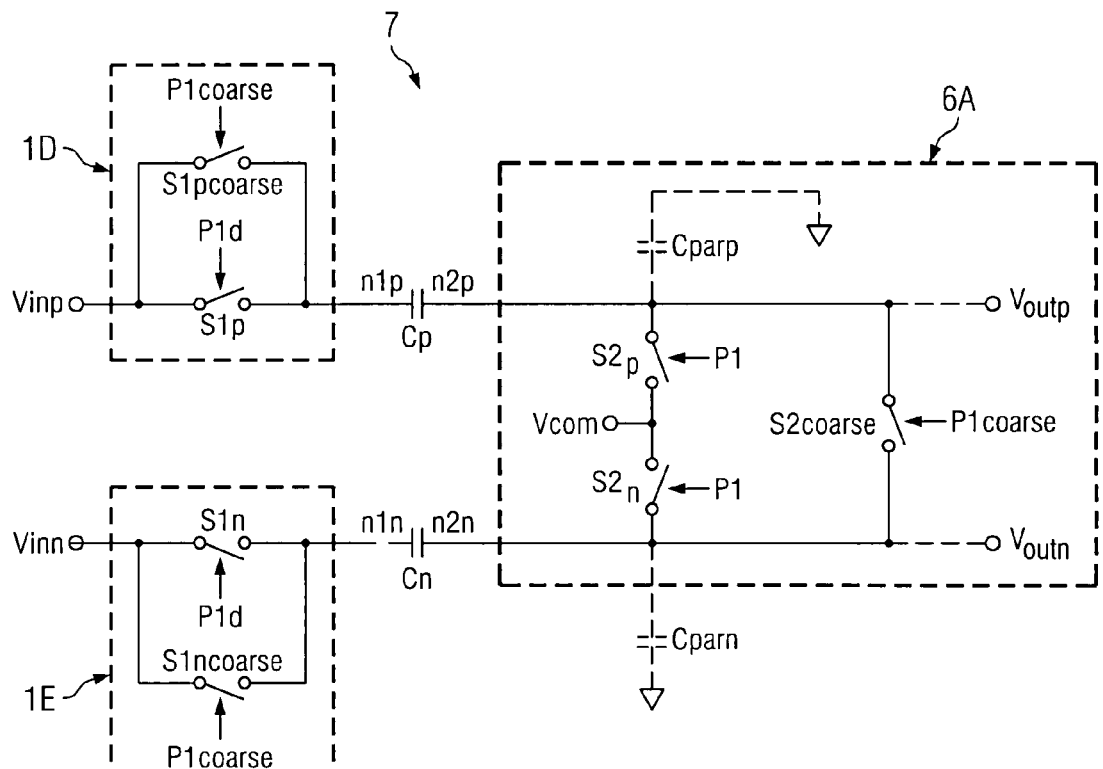
FIG. 8E is a diagram of another switched capacitor circuit in accordance with the present invention.
Figure 8F:
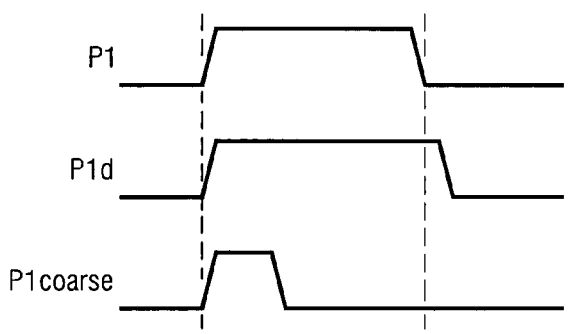
FIG. 8F is a timing diagram for the circuit of FIG. 8E.

FIG. 8E uses the invention to provide the circuitry 6 as in FIG. 8C and also to provide circuitry 1D and 1E instead of only switches S1p and S1n of FIG. 8A in order to further improve both linearity and common-mode rejection of the circuit presented in FIG. 8A. As indicated in FIG. 8F, the same clock signals are used as in the circuit of FIG. 8C. In the circuit of FIG. 8E the additional switches S1p$_{coarse}$ and S1n$_{coarse}$) both controlled by clock signal P1$_{coarse}$, are provided in parallel with switches S1p and S1n, respectively, and the size of switches S1p and S1n is reduced. The size reduction of switches S1p and S1n results in proportional reduction of charge injection and clock feed-through from those switches and correspondingly results in further improvement of linearity and common-mode rejection.

The present invention thus significantly reduces both charge injection and clock feed-through and also mismatches in charge injection and clock feed-through using a circuit/method that is very simple to implement, occupies very small layout area, requires very low power dissipation, and does not rely on component matching.

In contrast to previously mentioned prior art charge injection compensation schemes which aim to compensate for the charge injected into critical circuit nodes after it has been injected by the turning off of the critical MOS switches, the present invention significantly reduces both charge injection and clock feed-through and also reduces mismatches in charge injection and clock feed-through prior to the critical clock edge at which the charge injection occurs. Typically the switches are relatively small devices, and that means that they cannot be matched very well. The effectiveness of the present invention relies on reducing the size of the critical switch and does not rely on matching of components.

Compared to other charge compensation schemes, the described invention has the advantages that (1) it significantly reduces both charge injection and clock feed-through as well as mismatches in charge injection and clock feed-through prior to the critical clock edge at which the charge injection and clock feed-through occurs, (2) it is very simple to implement, (3) it requires only a very small additional amount of integrated circuit chip layout area, (4) it requires very low power dissipation, (5) it does not rely on component matching, and (6) it is applicable to any switch element (larger than minimum size) and any switched capacitor circuit topology.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. An apparatus comprising:
a first transistor switch having a first resistance ($R_{S1}$), wherein the first transistor switch is coupled to an input node, and wherein the first transistor switch is actuated by a first clock signal having a first pulse duration (ts);
a second transistor switch having a second resistance ($R_{S2}$), wherein the second transistor switch is coupled to the input node, and wherein the second transistor switch is actuated by a second clock signal having a second pulse duration (m·ts), and wherein the first pulse duration and the second pulse duration begin at substantially the same time; and
a capacitor having a capacitance (C), wherein the capacitor is coupled to each of the first and second transistor switches, and wherein the capacitor is charged such that an error voltage after the second pulse duration is:

$$er_B(m \cdot ts) = e^{-\left(\frac{ts}{C} \cdot m \cdot \frac{R_{S1}+R_{S2}}{R_{S1} \cdot R_{S2}}\right)}$$

and such that the error voltage after the first pulse duration is:

$$er_B(ts) = e^{-\left(\frac{ts}{C} \cdot m \cdot \frac{R_{S1}+R_{S2}}{R_{S1} R_{S2}} + \frac{1-m}{R_{S1}}\right)},$$

and wherein $R_{S1}$, $R_{S2}$, and m are selected to have the same settling accuracy as if the first and second transistor switches were to be replaced by a single transistor switch actuated by the first clock signal and having a series resistance ($R_S$), and wherein $R_S$, $R_{S1}$, $R_{S2}$, and m are related by the following expression:

$$R_S = \frac{R_{S1} \cdot R_{S2}}{m \cdot (R_{S1} + R_{S2}) + (1-m) \cdot R_{S2}}.$$

2. The apparatus of claim 1, wherein the first and second resistances ($R_{S1}$ and $R_{S2}$) are each a resistances of a MOS transistor.

3. The apparatus of claim 1, wherein the apparatus further comprises a buffer that is coupled between the input node and the second transistor switch.

4. The apparatus of claim 1, wherein at least one of the first and second transistor switches is an N-channel transistor.

5. The apparatus of claim 1, wherein at least one of the first and second transistor switches is a CMOS transmission gate.

6. The apparatus of claim 1, wherein m has a value in the range from approximately 0.1 to 0.6.

7. The apparatus of claim 1, wherein the capacitor includes a parasitic capacitance.

8. An apparatus comprising:
a series resistance (R);

a first transistor switch having a first internal resistance ($R_{S1}$), wherein the first transistor switch is coupled to an input node, and wherein the first transistor switch is actuated by a first clock signal having a first pulse duration (ts), and wherein the first internal resistance ($R_{S1}$) is $x \cdot R$;

a second transistor switch having a second internal resistance ($R_{S2}$), wherein the second transistor switch is coupled to the input node, and wherein the second transistor switch is actuated by a second clock signal having a second pulse duration (m·ts), and wherein the first pulse duration and the second pulse duration begin at substantially the same time, and wherein the second internal resistance ($R_{S2}$) is $$\frac{1}{x}R,$$

and wherein m is $$\frac{x-1}{x^2};$$

and a capacitor having a capacitance (C), wherein the capacitor is coupled to each of the first and second transistor switches, and wherein $R_{S1}$, $R_{S2}$, and m are selected to have the same settling accuracy as if the first and second transistor switches were to be replaced by a single transistor switch actuated by the first clock signal and having the series resistance (R), and wherein R, $R_{S1}$, $R_{S2}$, and m are related by the following expression:

$$R_S = \frac{R_{S1} \cdot R_{S2}}{m \cdot (R_{S1} + R_{S2}) + (1-m) \cdot R_{S2}}.$$

9. The apparatus of claim 8, wherein the first and second internal resistances ($R_{S1}$ and $R_{S2}$) are each resistances of a MOS transistor.

10. The apparatus of claim 8, wherein the apparatus further comprises a buffer that is coupled between the input node and the second transistor switch.

11. The apparatus of claim 8, wherein at least one of the first and second transistor switches is an N-channel transistor.

12. The apparatus of claim 8, wherein at least one of the first and second transistor switches is a CMOS transmission gate.

13. The apparatus of claim 8, wherein x is 2 so that $R_{S1}$ is 2R, $R_{S2}$ is 0.5R, and m is 0.25.

14. The apparatus of claim 8, wherein the capacitor includes a parasitic capacitance.

* * * * *